(12) United States Patent
Hartman et al.

(10) Patent No.: US 9,622,324 B2
(45) Date of Patent: Apr. 11, 2017

(54) GEOLOCATION AID AND SYSTEM

(71) Applicant: GENERAL ELECTRIC COMPANY, Schenectady, NY (US)

(72) Inventors: Michael James Hartman, Clifton Park, NY (US); Bruce Gordon Barnett, Niskayuna, NY (US); John Erik Hershey, Ballston, NY (US); Ralph Thomas Hoctor, Saratoga Springs, NY (US); Michael Joseph Dell'Anno, Niskayuna, NY (US); Stanislava Soro, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 40 days.

(21) Appl. No.: 14/546,954

(22) Filed: Nov. 18, 2014

(65) Prior Publication Data

US 2015/0141044 A1    May 21, 2015

Related U.S. Application Data

(60) Provisional application No. 61/907,090, filed on Nov. 21, 2013, provisional application No. 61/907,078, (Continued)

(51) Int. Cl.
*G01S 11/06* (2006.01)
*F21V 33/00* (2006.01)
(Continued)

(52) U.S. Cl.
CPC .......... *H05B 37/0227* (2013.01); *G01P 15/18* (2013.01); *G01R 22/06* (2013.01); *G01S 11/06* (2013.01); *G08B 21/18* (2013.01); *G08G 1/087* (2013.01); *H04W 4/046* (2013.01); *H05B 37/0263* (2013.01); *H05B 37/0272* (2013.01); *F21V 33/00* (2013.01); *F21W 2131/103* (2013.01); *G01S 11/02* (2013.01); *G01S 11/12* (2013.01); *Y02B 20/72* (2013.01)

(58) Field of Classification Search
None
See application file for complete search history.

(56) References Cited

U.S. PATENT DOCUMENTS 4,704,610 A    11/1987    Smith et al.
4,878,754 A    11/1989    Homma et al.
(Continued)

FOREIGN PATENT DOCUMENTS

EP    1437270 A1    7/2004
EP    2131630 A2    12/2009
(Continued)

OTHER PUBLICATIONS

Atlas, "Optical Extinction by Rainfall", Journal of Meteorology, vol. No. 10, pp. 486-488, Dec. 1953.
(Continued)

*Primary Examiner* — Todd Melton
(74) *Attorney, Agent, or Firm* — Pabitra K. Chakrabarti

(57) ABSTRACT

A method and system for geolocation using a street light system having transponding technology. A predetermined band of radio frequencies employing spread spectrum technology is used to identify locations relative to an individual street light.

17 Claims, 8 Drawing Sheets

Related U.S. Application Data filed on Nov. 21, 2013, provisional application No. 61/907,069, filed on Nov. 21, 2013, provisional application No. 61/907,114, filed on Nov. 21, 2013, provisional application No. 61/907,133, filed on Nov. 21, 2013, provisional application No. 61/907,150, filed on Nov. 21, 2013, provisional application No. 61/907,168, filed on Nov. 21, 2013, provisional application No. 61/907,188, filed on Nov. 21, 2013, provisional application No. 61/907,210, filed on Nov. 21, 2013.

(51) Int. Cl.

| | | |
|---|---|---|
| H05B 37/02 | (2006.01) | |
| G08G 1/087 | (2006.01) | |
| H04W 4/04 | (2009.01) | |
| G01R 22/06 | (2006.01) | |
| G01P 15/18 | (2013.01) | |
| G08B 21/18 | (2006.01) | |
| F21W 131/103 | (2006.01) | |
| G01S 11/02 | (2010.01) | |
| G01S 11/12 | (2006.01) | |

(56) References Cited

U.S. PATENT DOCUMENTS

| | | | |
|---|---|---|---|
| 5,014,052 A | | 5/1991 | Obeck |
| 5,028,129 A | * | 7/1991 | Smith ............... G01S 11/12 342/129 |
| 5,199,044 A | | 3/1993 | Takeuchi et al. |
| 5,243,185 A | | 9/1993 | Blackwood |
| 5,345,232 A | | 9/1994 | Robertson |
| 5,519,692 A | | 5/1996 | Hershey et al. |
| 5,519,725 A | | 5/1996 | Hershey et al. |
| 5,526,357 A | | 6/1996 | Jandrell |
| 5,557,261 A | | 9/1996 | Barbour |
| 5,563,728 A | | 10/1996 | Allen et al. |
| 5,563,906 A | | 10/1996 | Hershey et al. |
| 5,568,507 A | | 10/1996 | Hershey et al. |
| 5,568,508 A | | 10/1996 | Hershey |
| 5,568,509 A | | 10/1996 | Hershey et al. |
| 5,568,522 A | | 10/1996 | Hershey et al. |
| 5,682,100 A | | 10/1997 | Rossi et al. |
| 5,761,238 A | | 6/1998 | Ross et al. |
| 5,822,099 A | | 10/1998 | Takamatsu |
| 5,844,949 A | | 12/1998 | Hershey et al. |
| 5,852,243 A | | 12/1998 | Chang et al. |
| 5,903,594 A | | 5/1999 | Saulnier et al. |
| 6,011,508 A | | 1/2000 | Perreault et al. |
| 6,101,214 A | | 8/2000 | Hershey et al. |
| 6,122,084 A | | 9/2000 | Britz et al. |
| 6,288,632 B1 | | 9/2001 | Hoctor et al. |
| 6,308,134 B1 | | 10/2001 | Croyle et al. |
| 6,346,875 B1 | | 2/2002 | Puckette et al. |
| 6,424,250 B1 | | 7/2002 | Puckette, IV et al. |
| 6,430,210 B1 | | 8/2002 | McGrath et al. |
| 6,433,976 B1 | | 8/2002 | Phillips |
| 6,459,998 B1 | | 10/2002 | Hoffman |
| 6,504,634 B1 | | 1/2003 | Chan et al. |
| 6,522,243 B1 | | 2/2003 | Saulnier et al. |
| 6,659,715 B2 | | 12/2003 | Kuesters et al. |
| 6,693,556 B1 | | 2/2004 | Jones et al. |
| 6,717,660 B1 | | 4/2004 | Bernardo |
| 6,943,668 B2 | | 9/2005 | Gaus, Jr. et al. |
| 7,175,082 B2 | | 2/2007 | Hoshina |
| 7,248,149 B2 | | 7/2007 | Bachelder et al. |
| 7,294,977 B1 | | 11/2007 | Eusterbrock et al. |
| 7,418,346 B2 | | 8/2008 | Breed et al. |
| 7,460,787 B2 | | 12/2008 | Damink et al. |
| 7,580,705 B2 | | 8/2009 | Kumar |
| 7,629,899 B2 | | 12/2009 | Breed |
| 7,646,330 B2 | | 1/2010 | Karr |
| 7,817,063 B2 | | 10/2010 | Hawkins et al. |
| 7,834,555 B2 | | 11/2010 | Cleland et al. |
| 7,855,376 B2 | | 12/2010 | Cantin et al. |
| 7,876,864 B2 | | 1/2011 | Conrad et al. |
| 7,899,621 B2 | | 3/2011 | Breed et al. |
| 7,912,645 B2 | | 3/2011 | Breed et al. |
| 7,983,685 B2 | | 7/2011 | Silverstrim et al. |
| 7,983,836 B2 | | 7/2011 | Breed |
| 8,092,032 B2 | | 1/2012 | Pearse |
| 8,138,690 B2 | | 3/2012 | Chemel et al. |
| 8,140,276 B2 | | 3/2012 | Walters et al. |
| 8,227,995 B2 | | 7/2012 | Damink et al. |
| 8,232,745 B2 | | 7/2012 | Chemel et al. |
| 8,244,260 B2 | | 8/2012 | Silverstrim et al. |
| 8,260,537 B2 | | 9/2012 | Breed |
| 8,274,373 B2 | | 9/2012 | Nysen |
| 8,339,069 B2 | | 12/2012 | Chemel et al. |
| 8,368,321 B2 | | 2/2013 | Chemel et al. |
| 8,373,362 B2 | | 2/2013 | Chemel et al. |
| 8,384,312 B2 | | 2/2013 | Tsai |
| 8,436,748 B2 | | 5/2013 | Mimeault et al. |
| 8,441,214 B2 | | 5/2013 | Anderson |
| 8,442,403 B2 | | 5/2013 | Weaver |
| 8,442,785 B2 | | 5/2013 | Walters et al. |
| 8,456,325 B1 | | 6/2013 | Sikora |
| 8,475,002 B2 | | 7/2013 | Maxik et al. |
| 8,641,241 B2 | | 2/2014 | Farmer |
| 8,840,569 B2 | | 9/2014 | Flaction et al. |
| 8,842,009 B2 | | 9/2014 | Jones |
| 8,947,296 B2 | * | 2/2015 | Raz ............... G01S 13/08 342/145 |
| 9,192,026 B2 | | 11/2015 | Marquardt et al. |
| 9,192,029 B2 | | 11/2015 | Marquardt et al. |
| 2002/0141882 A1 | | 10/2002 | Ingistov et al. |
| 2005/0017647 A1 | | 1/2005 | Huang |
| 2005/0047864 A1 | | 3/2005 | Yamada et al. |
| 2005/0104745 A1 | | 5/2005 | Bachelder et al. |
| 2005/0187701 A1 | | 8/2005 | Baney |
| 2007/0063875 A1 | | 3/2007 | Hoffberg |
| 2007/0201540 A1 | | 8/2007 | Berkman |
| 2007/0229250 A1 | | 10/2007 | Recker et al. |
| 2008/0037241 A1 | | 2/2008 | Von Der Brelie |
| 2008/0072766 A1 | | 3/2008 | Kobylarz |
| 2008/0122642 A1 | | 5/2008 | Radtke et al. |
| 2008/0150757 A1 | | 6/2008 | Hutchison |
| 2008/0238720 A1 | | 10/2008 | Lee |
| 2009/0002982 A1 | | 1/2009 | Hu et al. |
| 2009/0033504 A1 | | 2/2009 | Tsai et al. |
| 2009/0034258 A1 | | 2/2009 | Tsai et al. |
| 2009/0066540 A1 | | 3/2009 | Marinakis et al. |
| 2009/0120299 A1 | | 5/2009 | Rahn et al. |
| 2009/0128328 A1 | | 5/2009 | Fan |
| 2009/0158739 A1 | | 6/2009 | Messmer |
| 2009/0164174 A1 | | 6/2009 | Bears et al. |
| 2009/0167508 A1 | | 7/2009 | Fadell et al. |
| 2009/0214198 A1 | | 8/2009 | Takahashi et al. |
| 2009/0268453 A1 | | 10/2009 | Pearse |
| 2009/0297156 A1 | | 12/2009 | Nakagawa et al. |
| 2010/0013608 A1 | | 1/2010 | Petrisor et al. |
| 2010/0029268 A1 | | 2/2010 | Myer et al. |
| 2010/0115093 A1 | | 5/2010 | Rice |
| 2010/0295473 A1 | | 11/2010 | Chemel et al. |
| 2010/0295474 A1 | | 11/2010 | Chemel et al. |
| 2010/0295475 A1 | | 11/2010 | Chemel et al. |
| 2010/0295482 A1 | | 11/2010 | Chemel et al. |
| 2010/0295943 A1 | | 11/2010 | Cha et al. |
| 2010/0296285 A1 | | 11/2010 | Chemel et al. |
| 2010/0301768 A1 | | 12/2010 | Chemel et al. |
| 2010/0301770 A1 | | 12/2010 | Chemel et al. |
| 2010/0301771 A1 | | 12/2010 | Chemel et al. |
| 2010/0301773 A1 | | 12/2010 | Chemel et al. |
| 2010/0301774 A1 | | 12/2010 | Chemel et al. |
| 2010/0301834 A1 | | 12/2010 | Chemel et al. |
| 2010/0302779 A1 | | 12/2010 | Chemel et al. |
| 2010/0308736 A1 | | 12/2010 | Hung et al. |
| 2010/0309209 A1 | | 12/2010 | Hodgins et al. |
| 2011/0001436 A1 | | 1/2011 | Chemel et al. |
| 2011/0001438 A1 | | 1/2011 | Chemel et al. |
| 2011/0001626 A1 | | 1/2011 | Yip et al. |
| 2011/0043035 A1 | | 2/2011 | Yamada et al. |

(56) References Cited

U.S. PATENT DOCUMENTS

| | | |
|---|---|---|
| 2011/0069960 A1 | 3/2011 | Knapp et al. |
| 2011/0095867 A1 | 4/2011 | Ahmad |
| 2011/0115384 A1 | 5/2011 | Chatelus |
| 2011/0140950 A1 | 6/2011 | Andersson |
| 2011/0156900 A1 | 6/2011 | Toda |
| 2011/0215736 A1 | 9/2011 | Horbst et al. |
| 2011/0227584 A1 | 9/2011 | Beck |
| 2011/0288658 A1 | 11/2011 | Walters et al. |
| 2012/0053888 A1* | 3/2012 | Stahlin ............... G01S 5/021 702/150 |
| 2012/0062123 A1 | 3/2012 | Jarrell et al. |
| 2012/0086560 A1 | 4/2012 | Ilyes et al. |
| 2012/0086561 A1 | 4/2012 | Ilyes et al. |
| 2012/0126721 A1 | 5/2012 | Kuenzler et al. |
| 2012/0136485 A1 | 5/2012 | Weber et al. |
| 2012/0140748 A1 | 6/2012 | Carruthers |
| 2012/0154239 A1 | 6/2012 | Bar-Sade et al. |
| 2012/0163826 A1 | 6/2012 | Schenk et al. |
| 2012/0209505 A1 | 8/2012 | Breed et al. |
| 2012/0218101 A1 | 8/2012 | Ford |
| 2012/0230696 A1 | 9/2012 | Pederson et al. |
| 2012/0245880 A1 | 9/2012 | Nabrotzky |
| 2012/0256777 A1 | 10/2012 | Smith et al. |
| 2012/0262304 A1 | 10/2012 | Cripps |
| 2012/0280825 A1 | 11/2012 | Sakakihara |
| 2012/0286673 A1 | 11/2012 | Holland et al. |
| 2012/0299721 A1 | 11/2012 | Jones |
| 2012/0299755 A1 | 11/2012 | Jones |
| 2012/0308239 A1 | 12/2012 | Sheth et al. |
| 2012/0309293 A1 | 12/2012 | Kummetz et al. |
| 2012/0321321 A1 | 12/2012 | Riesebosch |
| 2012/0323474 A1 | 12/2012 | Breed et al. |
| 2013/0044488 A1 | 2/2013 | Hreish |
| 2013/0057158 A1 | 3/2013 | Josefowicz et al. |
| 2013/0063281 A1 | 3/2013 | Malaska |
| 2013/0076523 A1 | 3/2013 | Kwan et al. |
| 2013/0101003 A1 | 4/2013 | Vedantham et al. |
| 2013/0140995 A1 | 6/2013 | Jones |
| 2013/0144490 A1 | 6/2013 | Lord et al. |
| 2013/0169468 A1 | 7/2013 | Johnson et al. |
| 2013/0172012 A1 | 7/2013 | Zudrell-Koch |
| 2013/0181636 A1 | 7/2013 | Agrawal |
| 2013/0214697 A1 | 8/2013 | Archenhold |
| 2013/0221858 A1 | 8/2013 | Silberstein |
| 2013/0229116 A1 | 9/2013 | Van Zeijl et al. |
| 2013/0257284 A1 | 10/2013 | VanWagoner et al. |
| 2013/0293117 A1 | 11/2013 | Verfuerth |
| 2013/0330172 A1 | 12/2013 | Scipio et al. |
| 2013/0346229 A1 | 12/2013 | Martin et al. |
| 2014/0055439 A1 | 2/2014 | Lee et al. |
| 2014/0085055 A1 | 3/2014 | Lee et al. |
| 2014/0124007 A1 | 5/2014 | Scipio et al. |
| 2014/0125250 A1 | 5/2014 | Wilbur |
| 2014/0175982 A1 | 6/2014 | Yao et al. |
| 2014/0191858 A1 | 7/2014 | Morgan et al. |
| 2015/0023668 A1* | 1/2015 | Spaulding .......... H04B 10/1129 398/106 |
| 2015/0173159 A1 | 6/2015 | Lin et al. |
| 2015/0319825 A1 | 11/2015 | Destine et al. |
| 2016/0094088 A1 | 3/2016 | Bjorn et al. |
| 2016/0095182 A1 | 3/2016 | Bjorn et al. |

FOREIGN PATENT DOCUMENTS

| | | | |
|---|---|---|---|
| EP | 2521426 A1 | 11/2012 | |
| GB | 2403357 A | 12/2004 | |
| JP | 05205193 A | 8/1993 | |
| JP | 2005248607 A | 9/2005 | |
| JP | 2009025209 A | 2/2009 | |
| JP | 2009103497 A | 5/2009 | |
| KR | 1020060008967 A | 1/2006 | |
| KR | 1020060102552 A | 9/2006 | |
| KR | 100986279 B1 | 10/2010 | |
| WO | 2005029437 A2 | 3/2005 | |
| WO | 2009148466 A1 | 12/2009 | |
| WO | 2010079388 A1 | 7/2010 | |
| WO | 2011142516 A1 | 11/2011 | |
| WO | 2012090142 A2 | 7/2012 | |
| WO | 2012140152 A1 | 10/2012 | |
| WO | 2013160791 A2 | 10/2013 | |

OTHER PUBLICATIONS

Noe et al., "Global Positioning System, A Navigation Algorithm for the Low-Cost GPS Receiver", The Institute of Navigation, vol. No. 1, pp. 166-172, 1980.
Proakis, "Spread Spectrum Signals for Digital Communication," in Digital Communications, for an overview of DS theory, pp. 1-27, 1983.
Hershey et al., "Random and Pseudorandom Sequences," Data Transportation and Protection, pp. 259-310, 1986.
"Millimeter Wave Propagation: Spectrum Management Implications" published by the FCC as Bulletin No. 70, Jul. 1997.
Pang et al., "LED Traffic Light as a Communications Device", Proceedings of the International Conference on Intelligent Transportation Systems, pp. 788-793, 1999.
Mimbela et al., "A Summary of Vehicle Detection and Surveillance Technologies Used in Intelligent Transportation Systems", Southwest Technology Development Institute, pp. 1-211, Nov. 30, 2000.
Bullimore, "Controlling Traffic With Radio", IEEE Review, vol. No. 47, Issue No. 1, pp. 40-44, Jan. 2001.
Chao-Qun et al., "Application of Low-voltage Power Line Communication in a City Street Lamp Long-distance Intelligent Monitoring System", Research and Developments, 2006.
Cho et al., "Street Lighting Control Based on LonWorks Power Line Communication", Power Line Communications and Its Applications, pp. 396-398, Apr. 2008.
Awan et al., "Characterization of Fog and Snow Attenuations for Free-Space Optical Propagation", Journal of Communications, vol. No. 4, Issue No. 8, pp. 533-545, Sep. 2009.
Rich, "Light Monitoring System Keeps Glendale, Ariz., Out of the Dark", Government Technology, Oct. 24, 2011.
"Monitoring and Evaluation Protocol for the Field Performance of LED Street Lighting Technologies", Light Savers Accelerating Advanced Outdoor Lighting, Prepared by Toronto Atmospheric Fund in Partnership with Ontario Municipal Street Lighting Focus Group and Ontario Power Authority, pp. 1-32, 2011.
Qian et. al., "Based on PLC and GPRS, ZigBee street lamp wireless control system", Electronic Design Engineering, vol. No. 20, Issue No. 3, Feb. 2012.
Stevens et al., "White Paper—The Benefits of 60 GHz Unlicensed Wireless Communications" as captured by Wayback machine, SUB10 systems.com, pp. 1-10, May 7, 2012.
"Wireless Control and Communication System for LED Luminaires and Other Devices", San Francisco Public Utilities Commission Power Enterprise, pp. 1-15, Jun. 7, 2012.
Zotos et al., "Case study of a dimmable outdoor lighting system with intelligent management and remote control", Telecommunications and Multimedia (TEMU), 2012 International Conference on, pp. 43-48, Jul. 30-Aug. 1, 2012.
Caillet et al., "LonMark, the open Smart Streetlight Platform", Lonmark International, pp. 1-16, Feb. 2013.
After Newtown: A new use for a weapons-detecting radar?, University of Michigan, Apr. 1, 2013.
Lee et al., "Distributed dimming control for LED lighting", Optics Express, vol. No. 21, Issue No. S6, pp. 1-16, Nov. 2013.
International Search Report and Written Opinion issued in connection with related PCT Application No. PCT/US2014/066954 dated Feb. 26, 2015.
International Search Report and Written Opinion issued in connection with related PCT Application No. PCT/US2014/066922 dated Feb. 26, 2015.
International Search Report and Written Opinion issued in connection with corresponding PCT Application No. PCT/US2014/066957 dated Mar. 5, 2015.

(56) References Cited

OTHER PUBLICATIONS

International Search Report and Written Opinion issued in connection with related PCT Application No. PCT/US2014/066917 dated Mar. 5, 2015.
International Search Report and Written Opinion issued in connection with related PCT Application No. PCT/US2014/066337 dated Mar. 6, 2015.
International Search Report and Written Opinion issued in connection with related PCT Application No. PCT/US2014/066948 dated Mar. 9, 2015.
International Search Report and Written Opinion issued in connection with related PCT Application No. PCT/US2014/066942 dated Mar. 20, 2015.
International Search Report and Written Opinion issued in connection with corresponding PCT Application No. PCT/US2014/066927 dated Feb. 27, 2015.
US Non-Final Office Action issued in connection with related U.S. Appl. No. 14/484,300 on Dec. 4, 2015.
US Non-Final Office Action issued in connection with related U.S. Appl. No. 14/546,256 on Dec. 30, 2015.
US Non-Final Office Action issued in connection with related U.S. Appl. No. 14/546,982 on Feb. 1, 2016.
US Non-Final Office Action issued in connection with related U.S. Appl. No. 14/543,892 on May 9, 2016.
US Non-Final Office Action issued in connection with related U.S. Appl. No. 14/546,916 on May 11, 2016.
Final Office Action issued in connection with related U.S. Appl. No. 14/546,256 on Jun. 2, 2016.
Notice of Allowance Office Action issued in connection with related U.S. Appl. No. 14/543,892 on Aug. 26, 2016.

* cited by examiner

GEOLOCATION AID AND SYSTEM

This application is a non-provisional of and claims the benefit of U.S. Provisional Patent Applications Ser. Nos. 61/907,069, 61/907,078, 61/907,090, 61/907,114, 61/907,133, 61/907,150, 61/907,168, 61/907,188 and 61/907,210 filed on Nov. 21, 2013, the entire contents of which are incorporated herein by reference.

BACKGROUND

Conventional systems, such as the global positioning service (GPS) and global navigation satellite service (GLONASS) can determine the geographic location of a device that is compatable with one of these systems. These conventional systems are complex, such as GPS systems, which require satellites. GPS receivers require a view of a sufficient number of the GPS satellites to keep the horizontal dilution of precision (HDOP) to a modestly low value. There are numerous instances for which these complex systems may fail to provide the desired geolocation services. Particularly, in urban areas, a GPS receiver may not be capable of receiving signals from GPS satellites due to one or more dielectric canyons formed by streets and/or the structural shielding of large metallic members.

In view of the above discussion, there remains a need in the art for geographic location systems that provide a cost-effective service within urban and other similarly shaded areas that can function properly where GPS and other systems are hampered because of the urban nature of the surroundings.

SUMMARY

Embodiments of the present specification relate generally to geolocation services, and more particularly to a system and method for determining a geographic location of a device. Existing infrastructure used to determine geographic locations typically employs devices using modern communication techniques and electronics.

BRIEF DESCRIPTION OF THE ILLUSTRATIONS

DETAILED DESCRIPTION

Various embodiments described herein address the needs of the prior art by providing exemplary systems and methods for geographical location of devices using street lighting systems. The street lighting system provides geographic location services for devices relative to the position of individual street lights.

Street lighting and other infrastructure services and devices are made more intelligent through instantiation of modern communication techniques and electronics. One such role is to provide an urban location service for vehicles and pedestrians.

Figure 1:
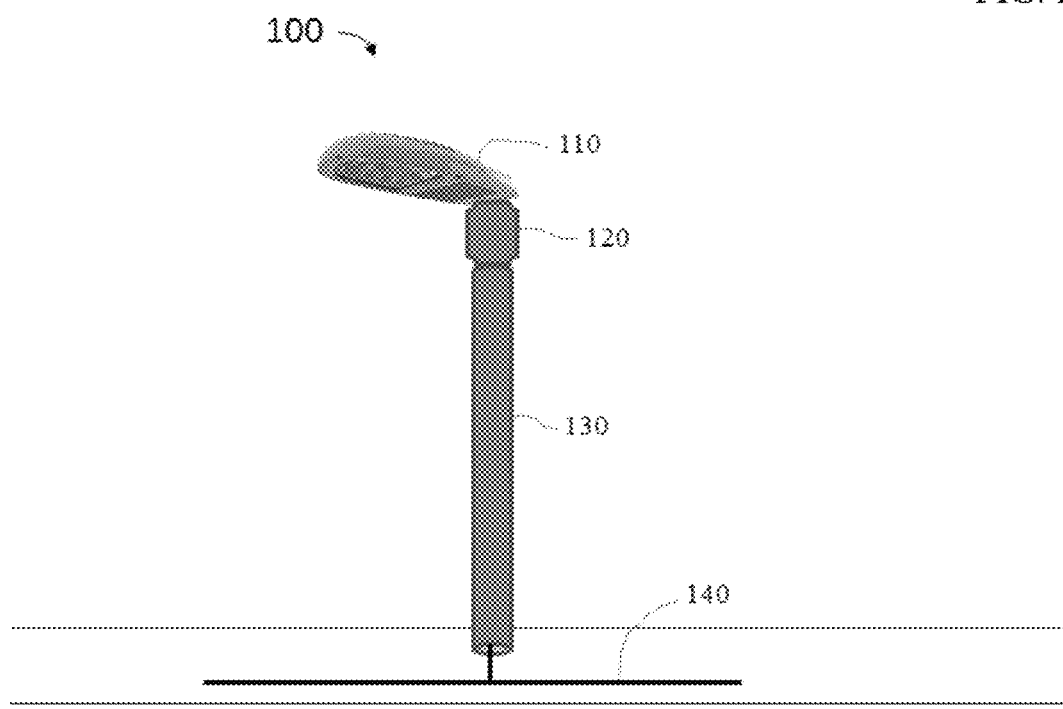
FIG. 1 illustrates the segmentation of a lighting fixture according to one embodiment.

A streetlight platform may be useful for an urban locating system. As depicted in FIG. 1, a smart street light 100 comprises a luminaire 110 mounted on top of luminaire associate 120 both of which are supported by pole 130. The luminaire associate 120 comprises the electronic components and circuitry used in the operation and control of the smart street light 100. The luminaire associate 120 also contains a communication system capable of transmitting and receiving radio frequency signals within a 57-64 GHz spectrum and computational elements including a processing device. Additionally, the luminaire associate provides mechanical couplings associated with the mounting and control of the luminaire 110. The luminaire associate 120 is mounted atop a pole 130. The pole 130 also provides a conduit for the powerline 140 serving the luminaire associate 120 and the luminaire 110. The luminaire associate 120 may perform one or more functions including providing power to the lamp, assessing the lamp's function, and connecting to a centralized streetlight control system. The lamp associate 120 may also provide an urban location service by providing a transponder service.

Figure 2:
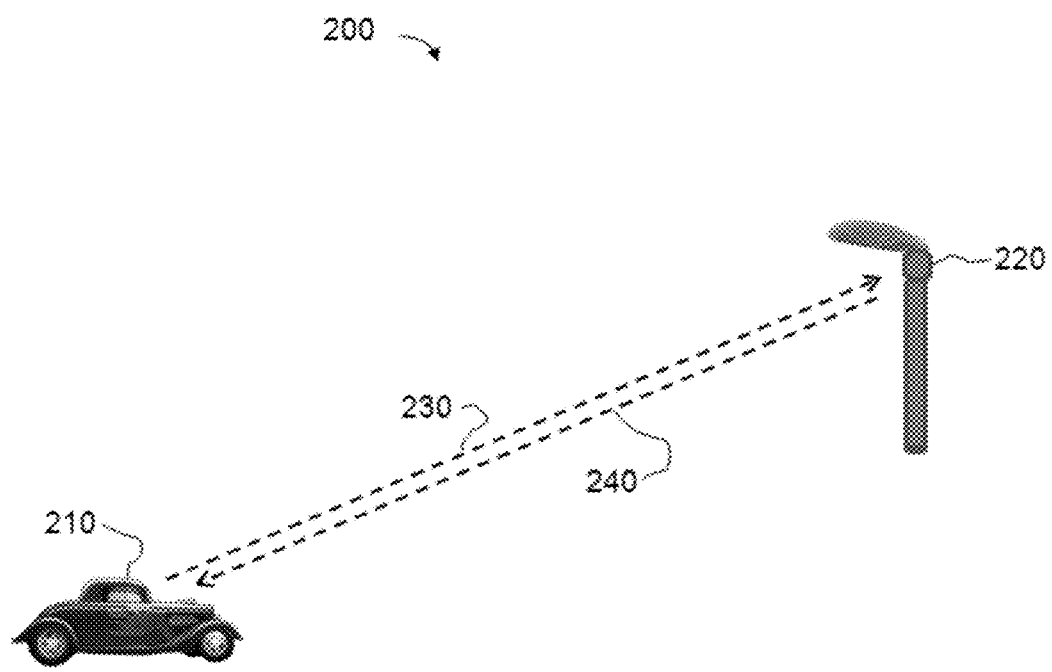
FIG. 2 illustrates a vehicle interrogating a luminaire associate according to one embodiment.

FIG. 2 is an illustration of a transponder service that may be performed by the exemplary embodiments described herein. The transponding sequence 200 begins by a communications system within vehicle 210 causing the transmission of an interrogation signal 230 through an antenna mounted on vehicle 210. The interrogation signal 230 is received by a luminaire associate 220. A transponder contained within luminaire associate 220 transponds with a response 240 that is received by the antenna and communications system on vehicle 210.

The response 240 from a particular luminaire associate 220 may contain data that uniquely identifies the luminaire associate 220 issuing the response 240. Upon receiving a response 240 uniquely identifying the particular luminaire associate 220, the vehicle 210 may have knowledge of the location of the uniquely identified luminaire associate 220. In accordance with varying embodiment, the communications system within the vehicle 210 may have immediate knowledge of location of the luminaire associate 220 by storing locations or through calculations. Other embodiments may provide for the communications system within vehicle 210 to acquire the locations of the luminaire associate through communications capability for quick access to, the geographical coordinates of the responding luminaire associate 220.

Figure 3:
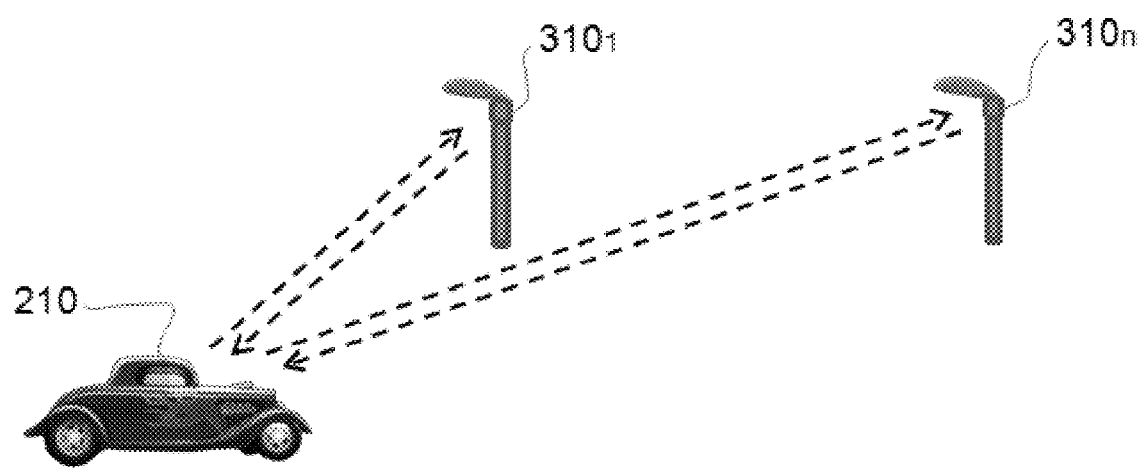
FIG. 3 illustrates a vehicle interrogating a plurality of luminaire associates according to one embodiment.

FIG. 3 is an illustration of a plurality of luminaire associates $310_1$-$310_n$ in the vicinity of vehicle 210. In an embodiment, the communications system within vehicle 210 may send interrogation signals 230 as it traverses the area occupied by the plurality of luminaire associates $310_1$-$310_n$. There will be a time delay between initiation of the interrogation signal 230 and a receipt of any potential response 240 from the plurality of luminaire associates $310_1$-$310_n$. These time delays can be measured and compared with one another. The interrogator determines locations along urban streets by determining relative distances to the plurality of luminaire associates $310_1$-$310_n$. A procedure for calculating position given a plurality of distances may be based on an algorithm presented in the "*Global Positioning System, A Navigation Algorithm for the Low-Cost GPS Receiver*," vol. 1. Pages 166-172, The Institute of Navigation, 1980, by S. Noe, K. A. Myers, and T. K. Wu.

The United States government has allocated a spectrum of 57-64 GHz for unlicensed operation. This provides a spectrum that is suitable for the creation of a system of transponders. This very large and contiguous portion of the electromagnetic spectrum has excellent attributes for a location system based on transponders contained within luminaire associates 220 that do not need to rely on a centralized control. Many of the benefits accrue from the frequency selective nature of the absorption of electromagnetic radiation that propagates through the atmosphere.

Figure 4:
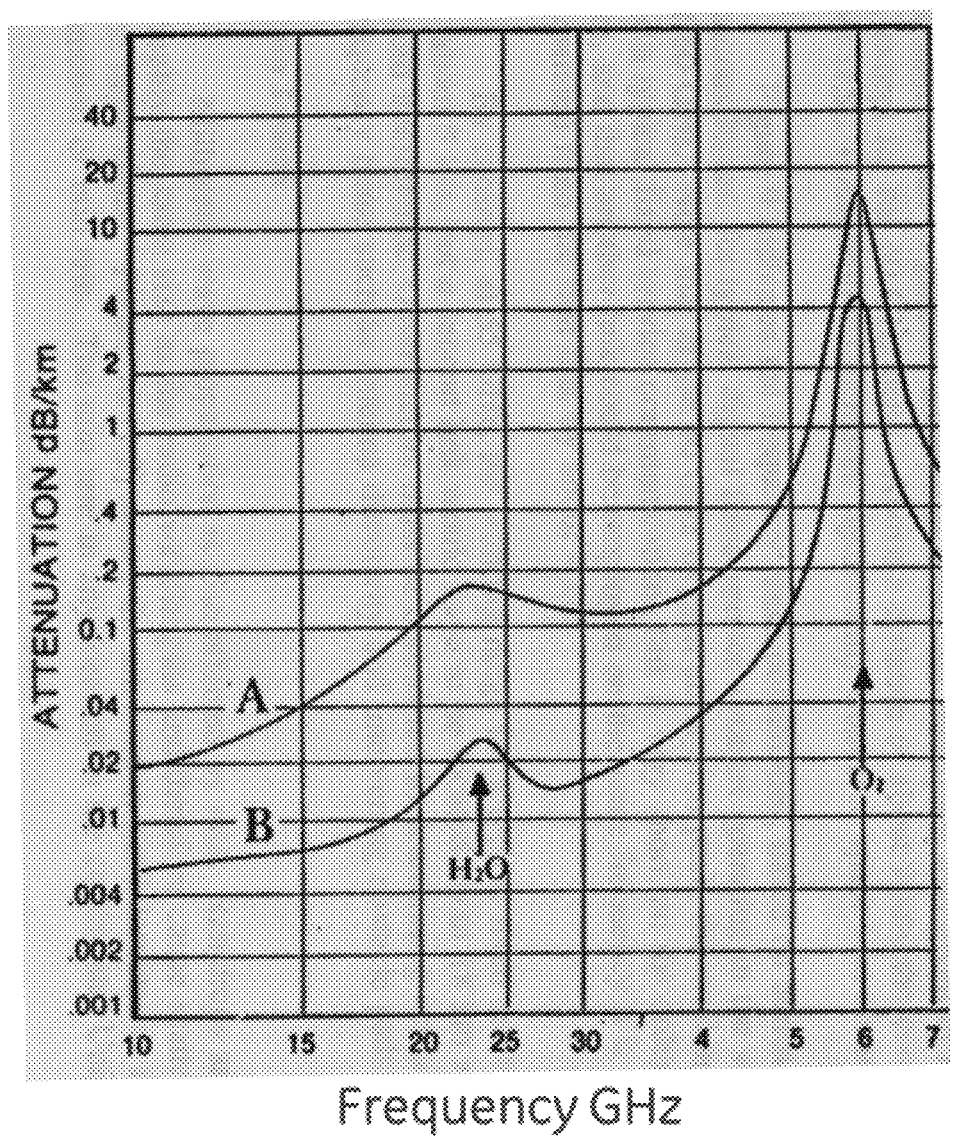
FIG. 4 is a graph of millimeter wave atmospheric attenuation.
Figure 5:
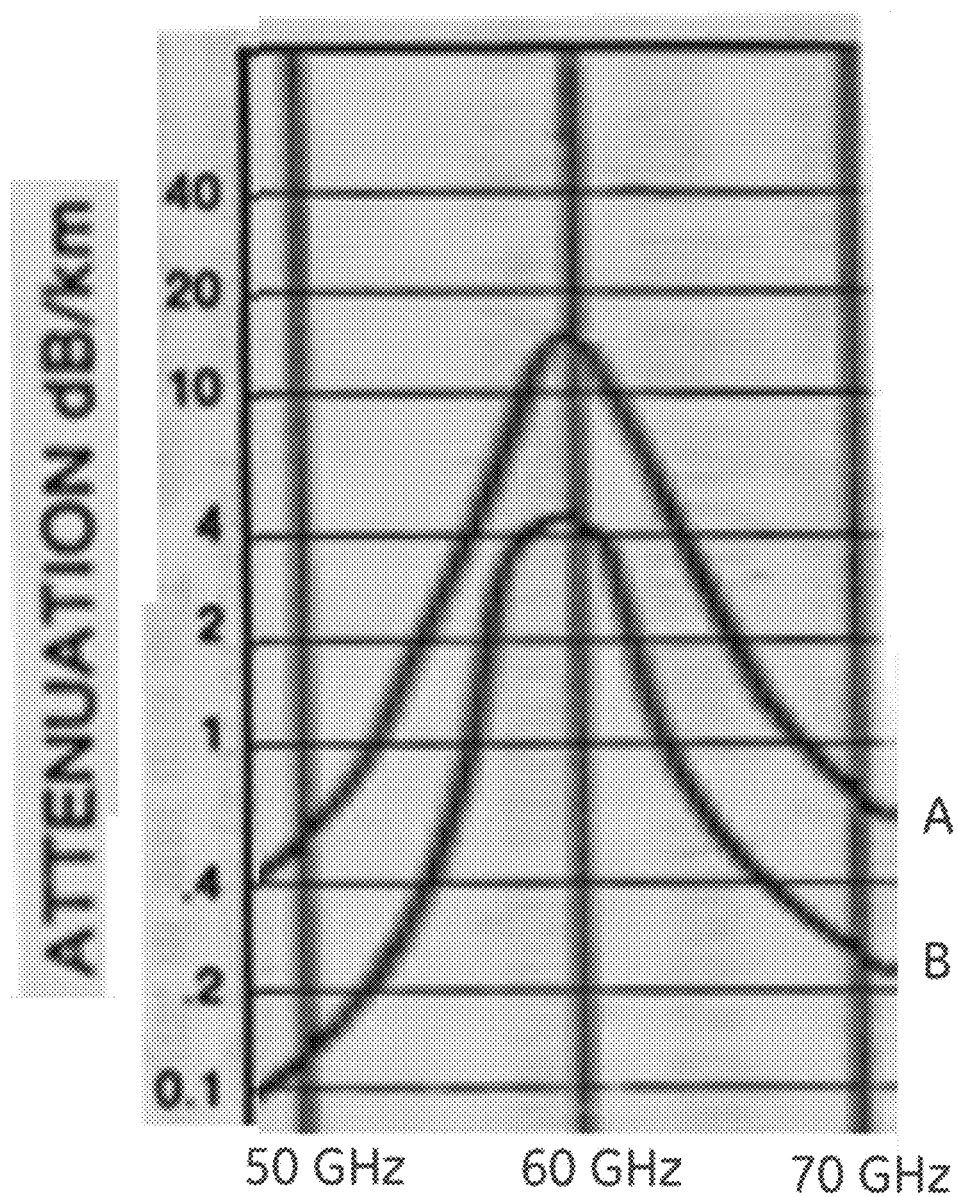
FIG. 5 is a portion of the graph of FIG. 4.

FIG. 4 is taken from figures in "Millimeter Wave Propagation: Spectrum Management Implications" published by the FCC as Bulletin Number 70, July, 1997. The figure shows the remarkable frequency selective attenuation of electromagnetic energy in the atmosphere at and around various frequencies. Curve A is for sea level with temperature at 20° C., pressure at 760 mm, and water content at 7.5 gm/cubic meter (75% humidity); curve B is for an altitude of 4 km above sea level with temperature at 0° C. and water content at 1 gm/cubic meter (relatively dry air). FIG. 5 is an extract of FIG. 4 emphasizing a frequency range comprising the unlicensed spectrum of 57-64 GHz and showing the high attenuation that is frequency selective due primarily to oxygen. The relatively high attenuation with distance can operate to reduce interference from other sources and also limit the impact of another potentially interfering luminaire associate that may be transponding.

Figure 6A:
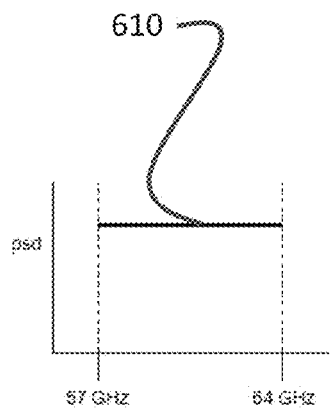
FIG. 6A is an illustration of the power spectral density (psd) of the transmitted interrogation signal across the spectral region from 57-64 GHz according to one embodiment.
Figure 6B:
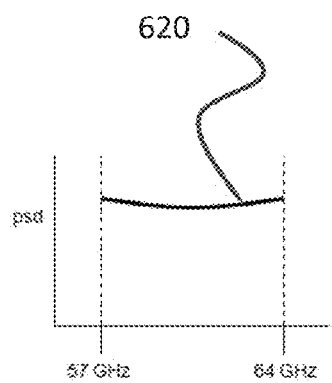
FIG. 6B is an illustration of the psd for the interrogation signal of FIG. 6A after traveling a short distance according to one embodiment.
Figure 6C:
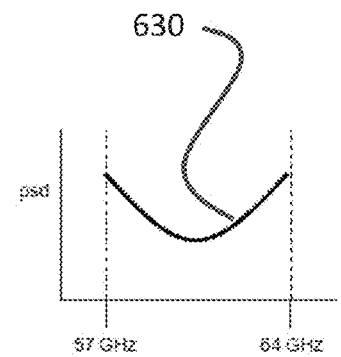
FIG. 6C is an illustration of the psd for the interrogation signal of FIG. 6A after traveling a significantly longer distance than illustrated in FIG. 6B according to one embodiment.

FIGS. 6A-6C illustrate examples of frequency selective attenuation that may be seen in transmissions detected by the embodiments discussed herein. FIG. 6A is an illustration of the shape of the power spectral density (psd) 610 of an interrogation signal 230 (as seen in relation to FIG. 2) as transmitted. As seen in FIG. 6A, the psd 610 of the transmitted interrogation signal 230 is flat over the spectral region from 57-64 GHz. FIG. 6B illustrates the psd 620 of the interrogation signal 230 as detected and received after traveling a short distance from the transmitter. The receiver may be coupled to computational devices and processing elements capable of measuring the psd 620 across the spectral region from 57-64 GHz and finding that the psd 620 for the detected interrogation signal 230 has frequency-dependent diminution that is more pronounced in the middle of the spectral region from 57-64 GHz. This frequency-dependent diminution is due to the frequency selective atmospheric absorption as referenced in FIG. 5 and the discussion related thereto. FIG. 6C illustrates the psd 630 within another detected or received interrogation signal 230 after traveling a much greater distance than shown in FIG. 6B. A receiver can measure the psd 630 as previously discussed and determine the amount of frequency-dependent diminution that has occurred within the center frequency of the spectral region from 57-64 GHz is much more pronounced than is the case corresponding to FIG. 6B.

For the diagrams shown in FIGS. 6B and 6C, measurements may be performed by computational elements and processing devices coupled to the receiver of interrogation signals 230 to estimate the distance that interrogation signals 230 have traveled from the amount of the frequency-dependent diminution for the center frequencies within the 57-64 GHz spectral region.

It should be noted that the values of the psd on the ordinate axes do not have to be the same between FIG. A, FIG. B and FIG. C as long as the psd is represented using the same scale, e.g., logarithmic for dBs.

Figure 6D:
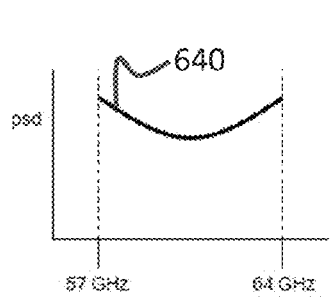
FIG. 6D illustrates the psd for a received interrogation signal according to one embodiment.

FIG. 6D illustrates a received interrogation signal 640 that has traveled a sufficient distance to cause frequency-dependent diminution of the psd as shown by the solid line depicting the received interrogation signal's psd 640. In order to estimate the distance D that the interrogation signal has traveled, a receiver may employ selective frequency absorptions, similar to those shown in the curves to FIG. 5, to estimate the distance D the interrogation signal would have to travel to cause the frequency-dependent diminution of the psd observed in FIG. 6D.

Figure 6E:
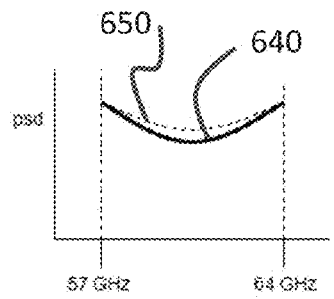
FIG. 6E illustrates an estimation of the psd in FIG. 6D according to one embodiment.

Referring to FIG. 6E, the detected/received psd 640 for interrogation signal 230 is shown as a solid line. Dotted line 650 represents a curve with an attenuation less than that shown by psd 640 illustrated by the solid line. In an embodiment, dotted line 650 represents a curve from a set of selective frequency absorptions similar to those shown in the curves to FIG. 5. Dotted line 650 may be viewed as a distance D1 that is less than the true distance D because the psd represented by dotted line 650 is above the observed psd 640 for detected/received interrogation signal 230.

Figure 6F:
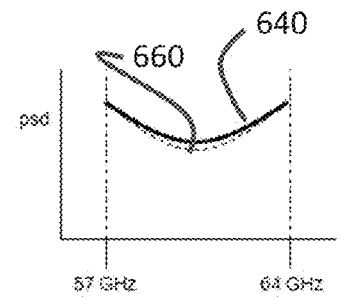
FIG. 6F illustrates another estimation of the psd in FIG. 6D according to one embodiment.

Referring to FIG. 6F, the detected/received psd 640 for interrogation signal 230 is again shown as a solid line. Dotted line 660 represents a curve with an attenuation of the psd for the central frequencies that is greater than that shown interrogation signal 640. In an embodiment, dotted line 660 represents a curve from a set of selective frequency absorptions similar to those shown in the curves to FIG. 5. Dotted line 660 is below the detected/received psd 640 for interrogation signal 230 because more attenuation occurs over the longer distance D2 traveled by the signal that dotted line 660 represents. The distance D2 is greater than the true distance D because the psd shown by dotted line 660 lies below the observed psd 640 shown by the solid line for the interrogation signal.

In an embodiment, the distance D, between the transmitter and receiver, is that distance that causes a transmitted signal with a flat psd between 57-64 GHz to be received as a signal with a psd that has been frequency selectively attenuated according to the frequency selective absorption characteristics of the atmosphere through which the signal propagated for a distance D.

An embodiment exploits the frequency dependent absorption behavior of the atmosphere on the 57-64 GHz unlicensed spectrum by providing an estimate of the distance that a transmitted signal has traveled to a receiver within this unlicensed spectrum. By having knowledge or obtaining the frequency dependent absorption values for the unlicensed spectrum within a geographic proximity to the operation of the geolocation system, this information may be used to generate location estimates. The frequency dependent absorption values may be obtained through measurements made by a metrological service and electronically distributed to the components of the geolocation system. Another manner of the geolocation system to gain knowledge of this information is to enter estimates into the geolocation system that remain invariant. In many cases, this latter practice may introduce only minor and acceptable errors into the processing. The information related to frequency dependent absorption values may be used for processing performed by the geolocation system.

In an embodiment, the geolocation system has knowledge of the power spectral density of signals that are transmitted within the 57-64 GHz unlicensed spectrum. Once the signal is received it is measured to determine the power spectral density of the received signal. The frequency dependent absorption values, known to the geolocation system, are used to estimate the distance the received signal has traveled. The estimate is made by using the frequency dependent absorption values to determine the distance the signal would have to travel to cause the transmitted power spectral density to have the shape of the power spectral density of the received signal.

The contiguous bandwidth available for communication in the unlicensed 57-64 GHz spectrum is 7 GHz wide and provides a significant amount of spectrum. There are numerous known modulation and communication protocol schemes that may be used for transmitting interrogation signals and transponding messages within a common RF spectrum. As an example embodiment, and not by way of limitation, a simple bi-phase coded direct sequence (DS) spread spectrum system. The DS spread spectrum system uses a binary-valued sequence wherein each bit of the binary valued sequence is termed a chip, and each chip has a time duration, or chip width, of cw. An example of bi-phase coded DS spread spectrum system may be found within chapter 8, "Spread Spectrum Signals for Digital Communication," in *Digital Communications* by John G. Proakis, McGraw-Hill, 1983, for an overview of DS theory. A "chip" is a well known term within the art of DS systems.

In an embodiment, a DS transmitter employs binary phase shift keying (BPSK) combined with a binary-valued sequence. The binary valued sequence is a sequence in which a zero of the sequence causes no phase inversion of a sine wave and a one of the sequence causes a phase inversion. The phase shift keying is performed so that the boundaries of the binary-valued sequence are coincident with zero crossings of the sine wave.

Figure 7:
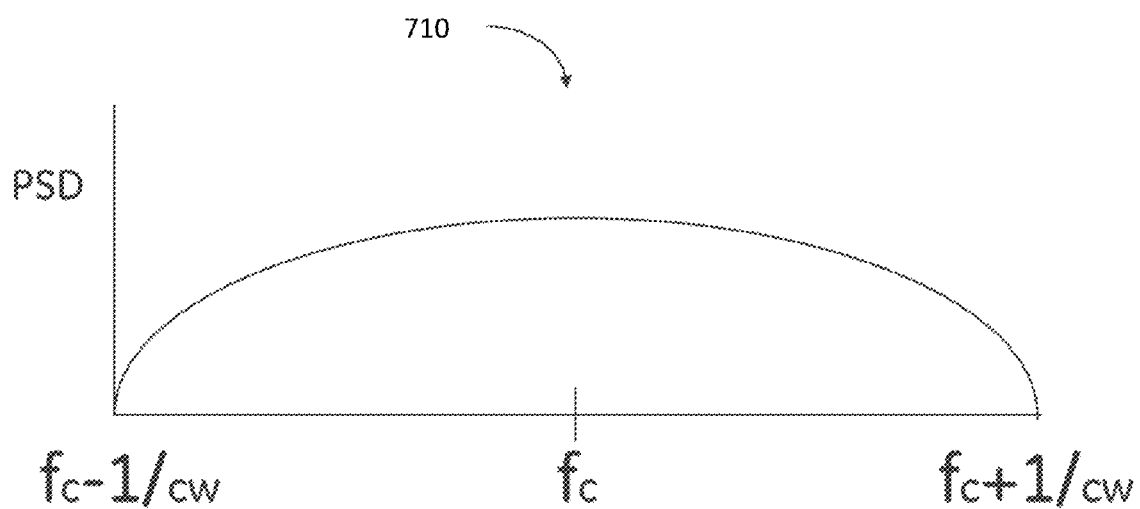
FIG. 7 illustrates the power spectral density of a DS spread spectrum signal according to one embodiment.

FIG. 7 is an illustration of the power spectral density (PSD) 710 of the main lobe of the transmitted signal within an embodiment. As seen in FIG. 6, the PSD 710 is symmetric about the center frequency $f_c$, and spans the frequency range $$f_c - \tfrac{1}{cw} \text{ to } f_c + \tfrac{1}{cw}$$

which comprises about 90% of the signal's power. In this embodiment, a chip rate of 3.5 gigachips per second with center frequency at 60.5 GHz is selected for the transmitted signal. These parameters spread the main lobe of the signal across the entire unlicensed band of 57-64 GHz. The spreading chips, a deterministic but pseudorandom sequence of binary values, will spread the signal energy approximately uniformly over the main lobe. Also, embodiments are possible that overlay two DS transmissions without creating significant interference in the demodulation of either provided the two spreading sequences used for the chips for each DS transmission are significantly decorrelated, where significant decorrelation means that under normal operating conditions one DS transmission will not be mistaken for the other.

In an embodiment, vehicles may interrogate luminaire associates with an interrogation signal having is a sequence of binary values, such as an m-sequence period or extract from an m-sequence period. Such a sequence is taught in chapter 8, "Random and Pseudorandom Sequences," in *Data Transportation and Protection* by John E. Hershey and R. K. Rao Yarlagadda, Plenum Press, 1986, for an overview of m-sequences. The m-sequence used in this embodiment is a unique interrogation sequence that is known and used by all participating vehicles. It is also known by all participating luminaire associates.

The luminaire associate responds with another unique sequence of binary values. An example may be another m-sequence period, or extract from an m-sequence period, that is significantly decorrelated with the vehicle interrogation sequence. The unique sequence is then combined with the BPSK signaling. The luminaire associate response signal will thus exhibit the same power spectral density as the vehicle interrogation signal. The unique luminaire associate response sequence is known and used by all participating luminaire associates. It is also known by all participating vehicles.

An embodiment for a protocol of determining vehicle distances with respect to a set of luminaire associates may have the communications system on a vehicle (equipped in a manner similar to the forgoing discussion) listening to ensure that no transmissions are in progress before initiating an interrogation signal. The vehicle then sends an interrogation signal 230 to the luminaire associates and waits for a response signal from one or more of the luminaire associates. Each luminaire associate that successfully receives and demodulates the vehicle interrogation signal uses a filter matched to the interrogation signal. The luminaire associate may employ filters on the received interrogation signal using a plurality of bandpass filters. The plurality of bandpass filters are such that they partition the spectrum of the interrogation signal. The luminaire associate may calculate a rough estimate of the distance to the interrogating vehicle by fitting the measured outputs of the plurality of bandpass filters to an atmospheric attenuation curve such as those displayed in FIG. 5.

In an embodiment, the luminaire associate 220 may remain silent for a period of time based on the estimate of the distance to the interrogating vehicle. The period of time that the luminaire associate remains silent is computed to prevent the response of the luminaire associate from colliding with responses from other luminaire associates. The silence interval may also comprise a randomly generated delay. The silence interval ends by the luminaire associate transmitting the response signal to the interrogating vehicle in a closed loop fashion regarding pre-emphasis, i.e., the luminaire associate 220 shapes the power of the response DS signal so that the vehicle 210 will receive a DS signal with a power spectral density that is approximately flat over the main lobe. The response from the luminaire associate is a DS transmission that reports the geographic location of the luminaire associate and the time delay between receiving the interrogation signal to the transmission time. The DS transmission from the luminaire associate uses a known extension of the sequence of binary values used for the response sequence data reporting its geographic location and the time that it waited from the receipt of the vehicle interrogation signal to the beginning of its transmission. The luminaire associate's DS transmission ceases after sending the response sequence data.

In an embodiment, the communication system within the vehicle 210 receives and demodulates the response 240 to the interrogation signal 230. The response from the luminaire associate 220 gives the geographic location of the luminaire associate 220 and the time delay incurred by the luminaire associate from receiving the interrogation signal to transmitting a response. Calculation is made of the round trip signal propagation time between transmission of the interrogation signal 230 by the vehicle and reception of the response 240 from the luminaire associate 220. The result of the calculation is used to determine the relative location of the vehicle to the responding luminaire associate 220. The communications system uses the reported location of the responding luminaire associate 220 combined with the relative location of the vehicle 210 to the responding luminaire associate 220 to determine the location of the vehicle 210.

In another embodiment, the communications system may also be provided with a Doppler system. If the vehicle is moving, the Doppler system can provide an estimate of the Doppler present in response to the interrogation signal sent by the luminaire associate and determine if the responding luminaire associate is ahead or behind the vehicle.

Embodiments employing wideband millimeter wave communication for location determining applications may have additional benefits. One of these is the mitigation of multipath problems. This is because many of the multipath rays greatly exceed the distance of a spreading sequence chip length. To counteract any very short multipath produced, for example, by reflection off of the vehicle's body, it may be a good engineering practice to use RF absorbing material on reflective areas lying forward of the transmitting aperture or it may be good practice to use circularly polarized transmissions with circularly polarized antennas with low axial-ratios.

Figure 8:
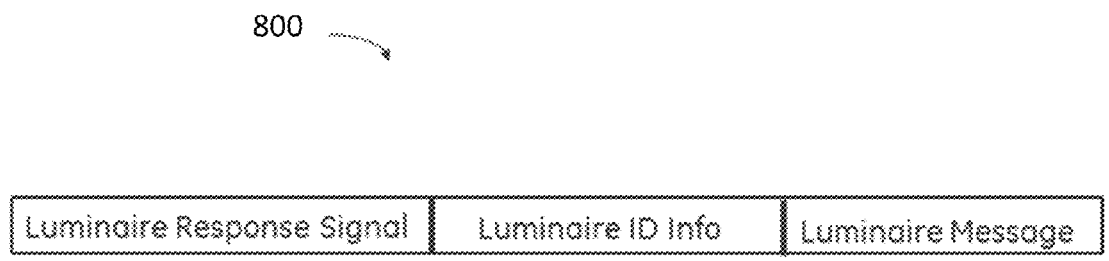
FIG. 8 illustrates an extended luminaire associate response message according to one embodiment.

In a further embodiment the response 240 from the luminaire associate 220 may carry information useful to vehicles such as road conditions, traffic delays, and accidents. As illustrated in FIG. 8, such information could be conveyed by extending the luminaire associate response informational signal 800.

In yet another embodiment, a vehicle 210 may generate a second signal that could convey a message to be inserted into a network by a receiving luminaire associate 220. In this embodiment, the signal from the vehicle could be a DS signal of the same power spectral density characteristics as the vehicle interrogation signal but combined with a unique binary valued sequence that is known to the luminaire associates and different from binary valued sequences used by the vehicle interrogator and luminaire associate response signals.

In another embodiment, some systems will handle and haul communications for other infrastructure systems. These messages may require a higher standard of care ensuring delivery or notification of non-delivery. When the streetlight optical signaling network is handling these messages, it may invoke a packet-handling protocol with strict accountability for assuring delivery and initiating retransmissions as required.

An exemplary technical effect of the methods and systems described herein includes: (a) generating a melt pool based on the build parameters of the component; (b) detecting an optical signal generated by the melt pool to measure the size or the temperature of the melt pool; and (c) modifying the build parameters in real-time based on the size or the temperature of the melt pool to achieve a desired physical property of the component.

Some embodiments involve the use of one or more electronic or computing devices. Such devices typically include a processor or controller, such as, without limitation, a general purpose central processing unit (CPU), a graphics processing unit (GPU), a microcontroller, a field programmable gate array (FPGA), a reduced instruction set computer (RISC) processor, an application specific integrated circuit (ASIC), a programmable logic circuit (PLC), and/or any other circuit or processor capable of executing the functions described herein.

The methods described herein may be encoded as executable instructions embodied in a computer readable medium, including, without limitation, a storage device, and/or a memory device. Such instructions, when executed by a processor, cause the processor to perform at least a portion of the methods described herein. The above examples are exemplary only, and thus are not intended to limit in any way the definition and/or meaning of the term processor.

Exemplary embodiments for enhancing the build parameters for making additive manufactured components are described above in detail. The apparatus, systems, and methods are not limited to the specific embodiments described herein, but rather, operations of the methods and components of the systems may be utilized independently and separately from other operations or components described herein. For example, the systems, methods, and apparatus described herein may have other industrial or consumer applications and are not limited to practice with electronic components as described herein. Rather, one or more embodiments may be implemented and utilized in connection with other industries.

Although specific features of various embodiments of the invention may be shown in some drawings and not in others, this is for convenience only. In accordance with the principles of the invention, any feature of a drawing may be referenced or claimed in combination with any feature of any other drawing.

This written description uses examples to disclose the invention, including the best mode, and to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A method for identifying positions within a geolocation system comprising:
    transmitting an interrogation signal from a vehicle;
    detecting the interrogation signal by a luminaire associate within at least one smart street light, wherein the smart street light has knowledge of a predetermined power spectral density shape of the interrogation signal transmitted by the vehicle;
    sending a response from the smart street light;
    receiving the response by the vehicle; and
    measuring outputs of a plurality of bandpass filters employed with the luminaire associate and thereby estimating a position of the vehicle within the geolocation system from the interrogation signal detected by the luminaire associate.

2. The method of claim 1 further comprising listening, prior transmitting, to determine that no interfering signals are present.

3. The method of claim 1 wherein the interrogation and the response signals are direct sequence (DS) spread spectrum signals within a 57-64 GHz spectrum of frequencies.

4. The method of claim 3 wherein sending further comprises shaping the power of the response DS signal such that the vehicle will receive a DS signal with a response signal power spectral density that is approximately flat over a main lobe of the DS signal.

5. The method of claim 3 further comprising computing using a computational device operatively coupled to the vehicle to calculate a round trip signal propagation time between the vehicle transmission of the interrogation signal and reception of the response from the smart street light.

6. The method of claim 5 wherein the response carries a positioning estimate of the vehicle relative to the smart street light and the computational device uses the positioning estimate and the round trip signal propagation time to estimate position of the vehicle.

7. The method of claim 1 further comprising:
measuring, after detecting, the power spectral density of the interrogation signal received by the smart street light to determine a difference in a shape of the power spectral density for the interrogation signal received by the smart street light as compared to the predetermined power spectral density shape used to transmit the interrogation signal; and
determining a distance traveled by the interrogation signal received by the smart street light by determining attenuation as a function of distance required to create the difference in the shape of the power spectral density.

8. The method of claim 7 wherein measuring further comprises comparing outputs from a plurality of band pass filters to the predetermined power spectral density shape.

9. The method of claim 1 further comprising the vehicle originating a second signal that is received by the smart street light and inserted into a communication network.

10. A system for identifying locations within a geolocation system comprising:
a vehicle having a communication system operatively coupled to a transmitter that is configured to transmit an interrogation signal;
at least one street light having a luminaire associate that detects the interrogation signal and sends a response signal;
a receiver operatively coupled to the communication system, that receives the response signal; and
a computational device operatively coupled to the communication system that calculates a time period between transmission of the interrogation signal and reception of the response signal,
wherein the luminaire associate comprises a processing device that is configured to estimate a distance from the vehicle to the luminaire associate, and
further wherein the processing device estimates the distance by measuring a shape of the power spectral density of the interrogation signal detected by the luminaire associate and compares the shape with prior knowledge of the power spectral density shape for the interrogation signal as transmitted.

11. The system of claim 10 wherein the interrogation and the response signals are direct sequence (DS) spread spectrum signals within a 57-64 GHz spectrum of frequencies.

12. The system of claim 11 wherein the processing device compares the shape of the power spectral density of the interrogation signal detected by the luminaire associate to power spectral densities indicative of distances traveled by signals within the 57-64 GHz spectrum of frequencies.

13. The system of claim 11 wherein the luminaire associate shapes power of the response DS signal such that the vehicle will receive a DS signal with a response signal power spectral density that is approximately flat over a main lobe of the DS signal.

14. The system of claim 11 wherein the response carries a positioning estimate of the vehicle relative to the luminaire associate and the computational device uses the positioning estimate and the time period to estimate position of the vehicle.

15. The system of claim 10 further comprising the communication system listening for transmissions and wherein the transmitter waits to transmit the interrogation signal until there are no detectable transmissions.

16. The system of claim 10 further comprising the communication system originating a second signal that is received by the luminaire associate and inserted into a communication network.

17. The system of claim 10 wherein the response from the luminaire associate carries information useful to vehicles.

* * * * *